United States Patent [19]
Goronkin et al.

[11] Patent Number: 5,410,160
[45] Date of Patent: Apr. 25, 1995

[54] INTERBAND TUNNELING FIELD EFFECT TRANSISTOR

[75] Inventors: Herbert Goronkin, Tempe; Jun Shen, Phoenix; Saied N. Tehrani, Scottsdale; X. Theodore Zhu, Chandler, all of Ariz.

[73] Assignee: Motorola, Inc., Schaumburg, Ill.

[21] Appl. No.: 894,963

[22] Filed: Jun. 8, 1992

[51] Int. Cl.$^6$ .................. H01L 29/161; H01L 29/205; H01L 29/225
[52] U.S. Cl. ........................................ 257/15; 257/20
[58] Field of Search ................... 351/16; 257/15, 20

[56] References Cited

U.S. PATENT DOCUMENTS

| | | | |
|---|---|---|---|
| 4,195,305 | 3/1980 | Moon | 357/16 |
| 4,207,122 | 6/1980 | Goodman | 148/33.4 |
| 4,458,261 | 7/1984 | Omura | 357/23.7 |
| 4,743,951 | 5/1988 | Chang et al. | 357/22 |
| 4,806,993 | 2/1989 | Voisin et al. | 357/4 |
| 5,079,601 | 1/1992 | Esake et al. | 357/4 |
| 5,113,231 | 5/1992 | Soderstrom et al. | 357/16 |

FOREIGN PATENT DOCUMENTS

| | | | |
|---|---|---|---|
| 59-63769 | 4/1984 | Japan | 357/22 |
| 59-100577 | 6/1984 | Japan | 357/22 |
| 60-263472 | 12/1985 | Japan | 357/22 |
| 62-45064 | 2/1987 | Japan | 357/16 |

OTHER PUBLICATIONS

Sercel et al., 'Type two broken gap quantum wires . . . ', Appl Phys Lttr, 57(15), pp. 1569–1571, 806 & 90.
Beresford et al., 'Interband tunneling . . . heterostructures', Appl Phys Lttr, 56(10), pp. 952–954, 5 Mar. 1990.
Zhu et al., 'Exitonic Insulator Transition . . . ', Solid State Comm, vol 75 No. 7, pp. 595–599, 1990.

Primary Examiner—Andrew J. James
Assistant Examiner—Stephen D. Meyer
Attorney, Agent, or Firm—Aaron B. Bernstein

[57] ABSTRACT

A field effect semiconductor device having multiple vertically stacked channels (12, 14, 16) separated by barrier layers comprising wide bandgap material (18) is provided. The channels (12, 14, 16) are formed on a wide bandgap buffer layer (11) and each channel is coupled a P-type drain region (22b). Each channel is also coupled to an N-type source region (25b). With appropriate gate bias on a gate electrode (17), quantized energy levels in the channels (12, 14, 16) are aligned providing peak current flow by electrons tunneling from the conduction band of one or more N-channels (12, 16) to the valence band of the P-channel (14).

11 Claims, 3 Drawing Sheets

INTERBAND TUNNELING FIELD EFFECT TRANSISTOR

BACKGROUND OF THE INVENTION

This invention relates, in general, to semiconductor devices, and more particularly, to a bipolar field effect transistor having charge transport by interband tunneling.

Semiconductor devices that have non-linear current-voltage characteristics allow greater functionality to be incorporated into smaller devices. Such devices are referred to herein as "multi-functional" devices. In recent years, a few multi-functional devices have been developed. Examples of such devices include Esaki diodes and resonant tunneling diodes. Most of these devices take advantage of the negative resistance that is caused by tunneling of electrons.

Even more useful for digital logic applications than non-linear diodes would be non-linear three terminal devices which provide gain. Resonant tunneling hot electron transistors and bipolar resonant tunneling transistors, are examples of currently available three terminal devices. Even though these devices show some nonlinear characteristics, the observed non-linearitites are small at room temperature and they are only operational at liquid nitrogen temperatures or below. Currently available devices also have bipolar transistor characteristics with very complicated and nonplanar processes, and consume high standby power.

What is needed is a room temperature field effect transistor with highly nonlinear current-voltage characteristics.

SUMMARY OF THE INVENTION

Briefly stated, the advantages of the present invention are achieved by a field effect semiconductor device having charge transport by electrons tunneling from one N-type material to another P-type material. Charge transport is controlled by a gate electrode. The device includes a P-type layer and an N-type layer separated by a wide bandgap barrier layer, where the P-type layer has a valence band energy greater than the conduction band energy of the N-type layer. An first conductivity type drain region is formed on one side of the gate electrode and a second conductivity type source region is formed on an opposite Side of the gate electrode.

DETAILED DESCRIPTION OF THE DRAWINGS

Figure 1:
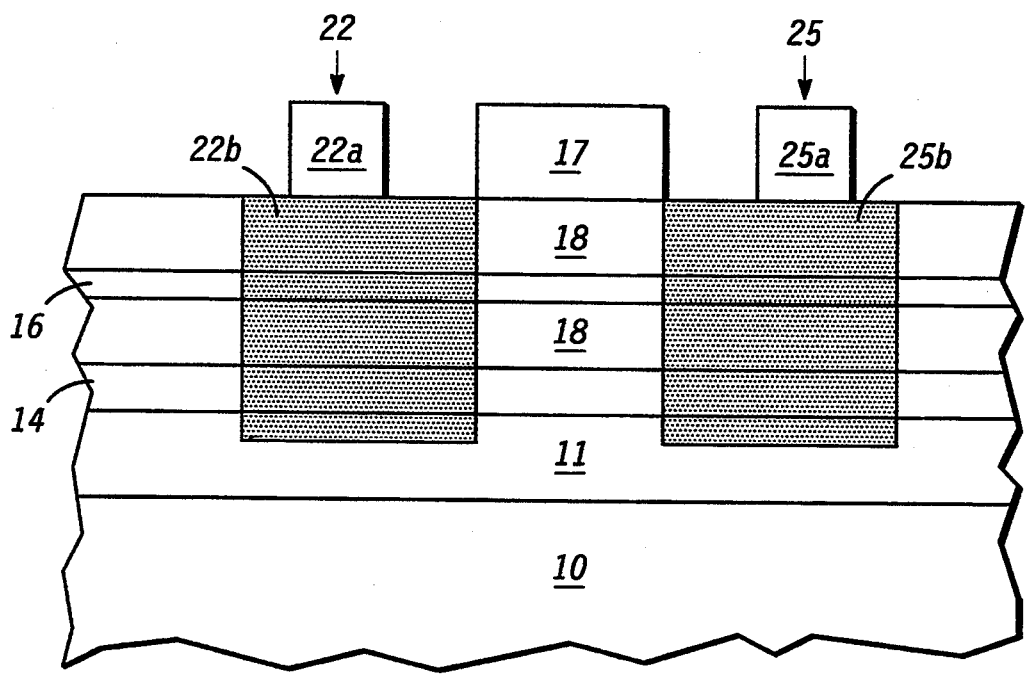
FIG. 1 illustrates a highly simplified cross section through a portion of a first embodiment tunneling bipolar field effect device in accordance with the present invention.
Figure 2:
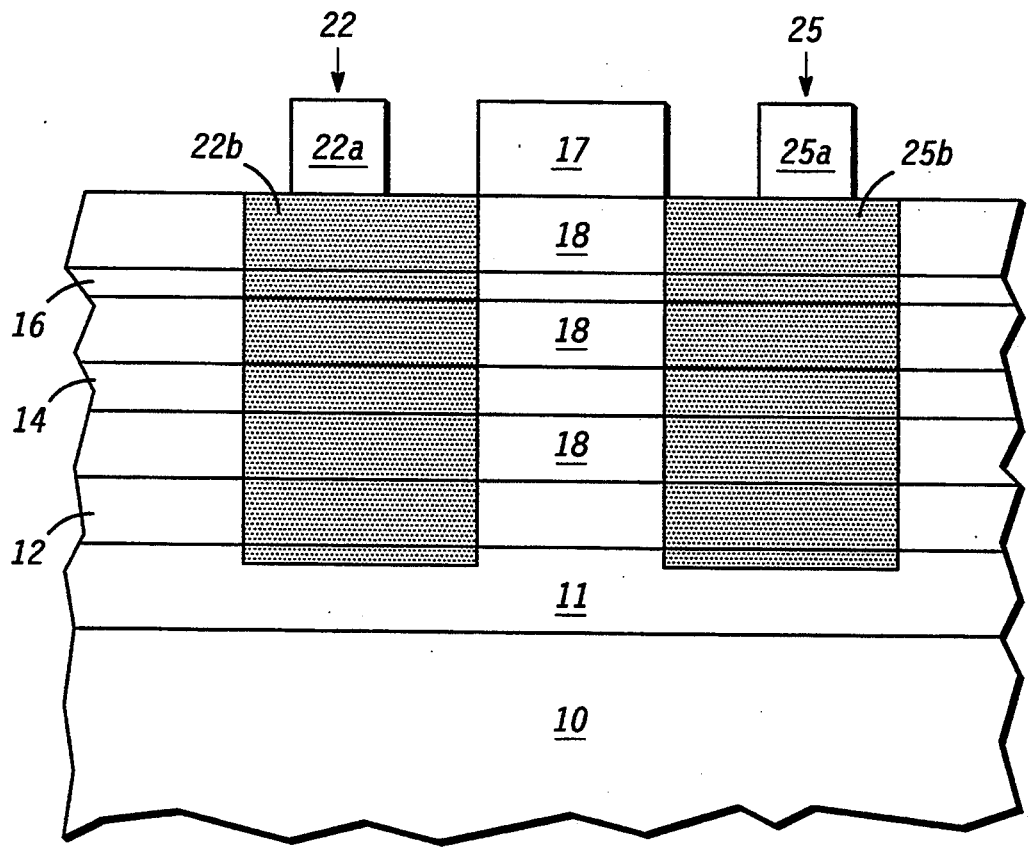
FIG. 2 illustrates a highly simplified cross section through a portion of a second embodiment tunneling bipolar field effect device in accordance with the present invention.

A primary concern in design of quantum well field effect transistors is the structure of the channel regions underneath the gate electrode as the channel region performance largely determines overall performance of the transistor. FIG. 1 and FIG. 2 illustrate highly simplified cross-sections through channel regions bipolar field effect transistors in accordance with the present invention. All material layers shown in FIG. 1 and FIG. 2 are substantially single crystal epitaxially grown layers. This requires that each epitaxial layer comprise a material which is crystallographically compatible with an underlying substrate. Therefore, in addition to electronic material constraints discussed hereinafter in regard to the particular embodiments, it should be noted that material choice is also limited by crystal properties. The epitaxial layers of the present invention may be grown by metal organic chemical vapor deposition (MOCVD), molecular beam epitaxy (MBE), or atomic layer epitaxy (ALE), or the like.

The embodiment shown in FIG. 1 includes a wide band gap buffer layer 11 comprising a material such as aluminum antimonide (AlSb) or aluminum gallium antimonide (AlGaSb) formed on a supporting crystalline substrate 10 such as semi-insulating gallium arsenide. Other wide band gap materials are known and used in compound semiconductor devices, but, as will be seen, AlSb is desirable in the preferred embodiments to ensure compatibility with other materials used in overlying layers of the preferred embodiments.

A P-channel quantum well 14 is formed covering buffer layer 11. Although thickness of P-channel quantum well 14 is not critical, in a preferred embodiment, P-channel quantum well 14 is in the range of ten to fifteen nanometers thick and comprises gallium antimonide (GaSb). P-channel quantum well 14 can be doped directly or by modulation doping techniques to improve conductivity if desired, but in a preferred embodiment remains undoped to maximize mobility. P-channel quantum well 14 is covered by a barrier layer 18 having a thickness of approximately three nanometers and comprising a material with a wide band gap such as AlSb or AlGaSb.

A first N-channel quantum well 16 is formed above P-channel quantum well 14 and covering barrier layer 18. N-channel quantum well 16 is in the range of ten to fifteen nanometers thick and comprises a material such as indium arsenide (InAs) in the preferred embodiments. Another barrier layer 18 is formed over first N-channel quantum well 16 and serves as a cap layer because it is the uppermost barrier layer. This uppermost barrier layer 18 also comprises a wide band gap material such as AlSb or AlGaSb, and in the preferred embodiment is approximately ten nanometers thick.

It should be noted that the structure shown in FIG. 1 can also be formed with P-channel quantum well 14 above N-channel quantum well 16. It is only necessary that the structure include both an N-channel and a P-channel that are separated by a barrier layer 18. For ease of illustration and description, the invention is described only in terms of a structure having an N-channel quantum well 16 formed above the P-channel quantum well 14, however.

Gate electrode 17 comprises a conductive material positioned on an upper surface of barrier layer 18 Gate electrode 17 makes Schottky contact to the uppermost barrier layer 18. An N-type source region 22b extends from the surface of the uppermost barrier layer 18 through N-channel quantum well 16, barrier layer 18, and P-channel quantum well 14. Source region 22b is formed by conventional doping and diffusion techniques such as ion implantation and thermal activation/redistribution. A P-type drain region 25b is formed on an opposite side of gate electrode 17, also using well known doping techniques. Preferably, gate electrode 17 serves as a mask for the formation of source region 22b and drain region 25b, simplifying manufacture of the device.

Subsequently, a source conductor 22a is formed making ohmic contact to source region 22b. Similarly, drain conductor 25a is formed making ohmic contact to drain region 25b. As used herein, source electrode 22 includes both source conductor 22a and source region 22b, and drain electrode 25 includes both drain conductor 25a and drain region 25b.

FIG. 2 illustrates an alternative embodiment tunneling bipolar field effect transistor in accordance with the present invention. Device elements illustrated in FIG. 1 which are the same in FIG. 2 are indicated with the same reference numerals used in FIG. 1. The primary difference between the first embodiment and that shown in FIG. 2 is the addition of a second N-channel quantum well 12 underneath P-channel quantum well 14. Second N-channel quantum well 12 is formed on top of buffer 11 and separated from P-channel quantum well 14 by a barrier layer 18. Second N-channel quantum well 12 comprises InAs and is thicker than first N-channel quantum well 16, being in the range of at least ten nanometers thick. It is believed that the addition of second N-channel quantum well 12 provides a more non-linear current voltage characteristic than the first embodiment, although both structures provide useful non-linearity.

Operation of the devices illustrated in FIG. 1 and FIG. 2 is substantially the same, and both devices can be understood by a detailed description of the functioning of the first embodiment shown in FIG. 1. Accordingly, operation of the tunneling bipolar field effect transistors in accordance with the present invention is described in terms of the structure shown in FIG. 1. The particular materials for P-channel quantum well 14 and N-channel quantum well 16 are chosen because P-channel quantum well 14 should have a valence band energy greater than conduction band energy of N-channel quantum well 16.

Figure 3:
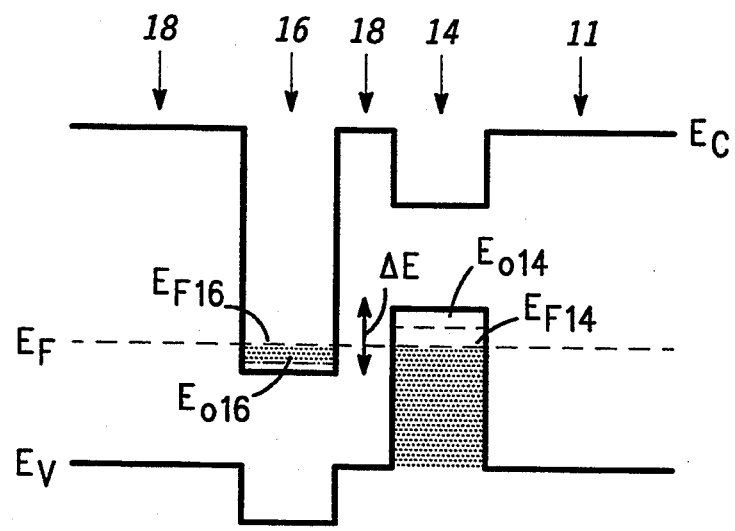
FIG. 3 illustrates a band diagram of the structure shown in FIG. 1 with no applied gate bias.
Figure 4:
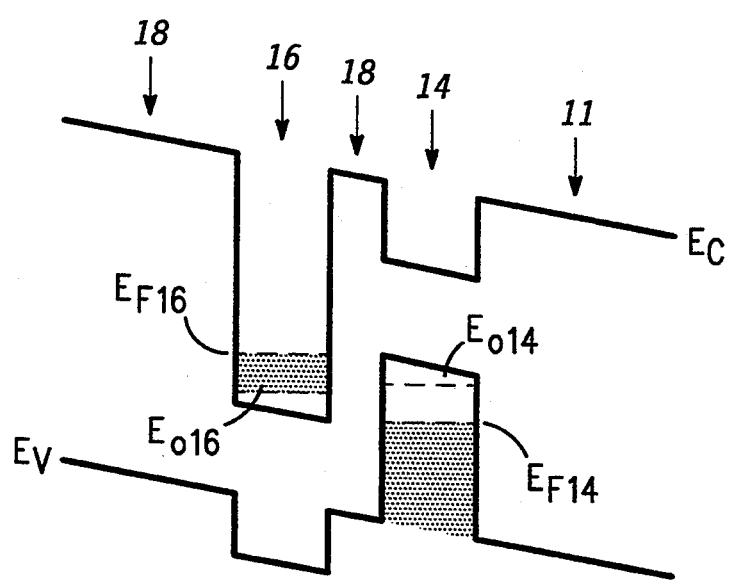
FIG. 4 illustrates a band diagram of the structure shown in FIG. 1 with first applied gate bias.
Figure 5:
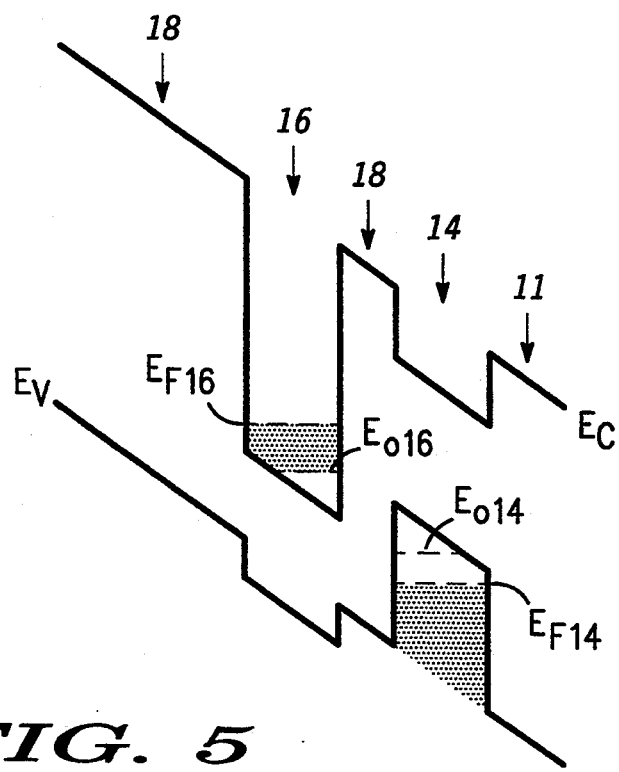
FIG. 5 illustrates a band diagram of the structure shown in FIG. 1 with second applied gate bias.

Conduction band energy ($E_c$) and valence band energy ($E_v$) are illustrated in bandgap diagrams shown in FIGS. 3–5. In FIGS. 3–5, the vertical axis represents relative energy in electron volts, and the horizontal axis represents thickness or depth within the device structure shown in FIG. 1. The left hand side of the drawings is upper surface, while the right hand side of the drawings is buffer layer 11. In FIGS. 3–5 a first quantized energy level, also called a ground state energy, in P-channel quantum well 14 is identified by a dashed line labeled $E_{014}$. Similarly, a first quantized energy level in N-channel quantum well 16 is identified by a dashed line labeled $E_{016}$.

A fermi energy level ($E_{F14}$) exists in P-channel quantum well 14 and is indicated by a dashed line within P-channel quantum well 14. Available energy states for charge carriers in P-channel quantum well 14 that lie below $E_{F14}$ are mostly full, as suggested by the shading below the dashed line in FIG. 3. Energy states above $E_{F14}$ and below ground state $E_{014}$ are empty. Likewise, $E_{F16}$ indicates a Fermi energy level existing in N-channel quantum well 16 and is identified by a dashed line through N-channel quantum well 16. Energy states above $E_{F16}$ are empty, while energy states below $E_{F16}$ and above the quantized ground state $E_{016}$ are mostly full of charge carriers, as suggested by the shading in N-channel quantum well 16 in FIG. 3.

N-channel quantum well 16 and P-channel quantum well 14 are separated from each other by wide band gap barrier 18. The thickness of barriers 18 is designed to allow overlap between the electron wave function in N-channel quantum well 16 and the hole wave function in adjacent P-channel quantum well 14. In other words, barrier 18 is thin enough that charge carriers can couple between P-channel quantum well 14 gates and the adjacent N-channel quantum well.

Figure 6:
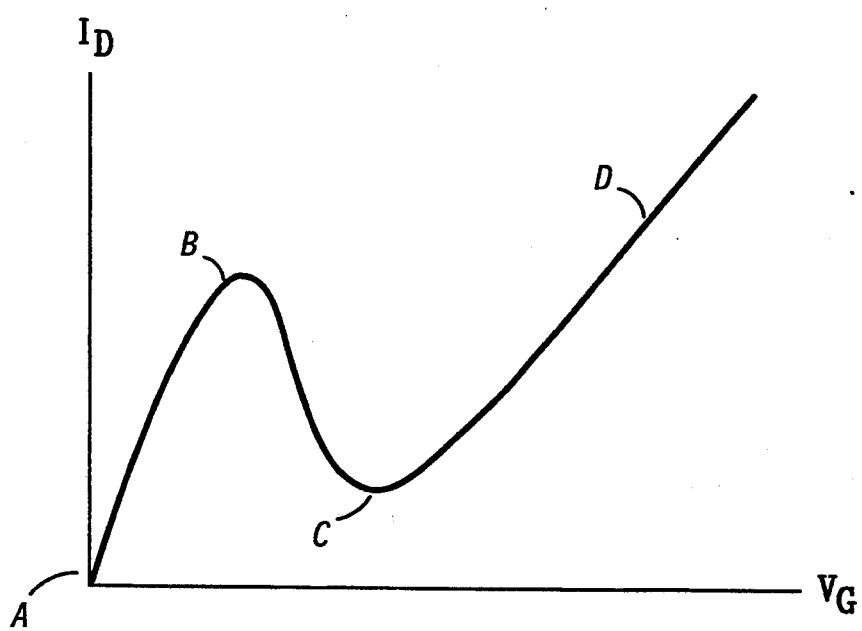
FIG. 6 illustrates a transfer characteristic for the structure shown in FIG. 1.

In operation, potential is applied to gate electrode 17 which alters the bandgap relationship by raising or lowering the energy bands of quantum wells located nearer the surface with respect to those quantum well positioned farther from the surface. FIG. 3 illustrates a zero bias or equilibrium condition. Under zero bias, $E_{F16} = E_{F14}$, as is suggested by the single dashed line labeled $E_F$ in FIG. 3. In this unbiased "equilibrium" condition, electrons in the conduction band of N-channel quantum well 16 exist primarily in energy states above $E_{016}$ and below $E_F$ and almost all of the empty or available energy states in P-channel quantum well 14 lie below the quantized ground state $E_{014}$ and above $E_F$, thus no charge transfer can occur between N-channel 16 and P-channel 14. Thus, with zero bias current cannot flow between N-channel 16 and P-channel 14. This is represented by condition "A" on the current voltage characteristic shown in FIG. 6. In FIG. 6, drain current is represented on the vertical axis and gate bias voltage is represented on the horizontal axis.

As bias is applied to gate electrode 17, the relative band energies shift as shown in FIG. 4. Here, negative bias on gate electrode 17 aligns the bands so that the occupied states in N-channel 16 align with the empty states in P-channel 14. In this case, a high peak current is achieved from source region 22b to drain region 25b, indicated by point "B" in FIG. 6. Electrons travel from source region 22 through N-channel quantum wells 12 and 16 where they tunnel to the empty states in the valence band of P-channel quantum well 14.

As illustrated in FIG. 5, further gate bias results in the occupied states below $E_{F16}$ and above $E_{016}$ moving out of alignment with the empty states above $E_{F14}$ and below $E_{014}$ so electron flow in channel 16 is blocked by the band gap of P-channel quantum well 14. This point is illustrated in FIG. 6 at position "C" reflecting a sharp drop off in current at this gate bias. Position B to position C is a negative resistance regime where increased gate bias results in lower current. Finally, as the magnitude of gate bias is further increased, electrons in N-channel quantum well 16 can tunnel to the conduction band of P-channel quantum well 14. This bias is represented by region "D" in FIG. 6 illustrating a rise in current.

By now it should be appreciated that a tunnelling bipolar field effect device with negative differential resistance is provided. The multiple channel device structures in accordance with the present invention allows optimal use of superior materials for FET technology as well as highly non-linear output for improved functionality.

We claim:

1. A tunneling field effect transistor comprising: a crystalline substrate; a buffer layer comprising a wide bandgap material formed on the substrate; a first quantum well channel of a first material composition formed on the buffer layer; a barrier layer comprising the wide bandgap material covering the first quantum well channel; a second quantum well channel of a second material composition positioned over the barrier layer; a cap layer comprising the wide bandgap material covering the second quantum well channel; a gate electrode positioned on top of the cap layer; a source region of a first conductivity type formed on one side of the gate electrode and extending from an upper surface of the cap layer through the cap layer, the first quantum well channel, the barrier layer, and the second quantum well channel to electrically couple to the second quantum well channel of the second material composition; and a drain region of a second conductivity type formed on an opposite side of the gate electrode from the source region and extending from the upper surface of the cap layer through the cap layer, the first quantum well channel, the barrier layer, and the second quantum well channel to electrically couple to the first quantum well channel of the first material composition.

2. The tunneling bipolar field effect transistor of claim 1 wherein one of the first or second material compositions has a valence band energy greater than the conduction band energy of the other of the first or second material composition.

3. The tunneling bipolar field effect transistor of claim 2 wherein the first material composition is gallium antimonide, the second material composition is indium arsenide, and the wide bandgap material comprises aluminum antimonide.

4. The tunneling bipolar field effect transistor of claim 3 wherein the first channel quantum well is in the range of ten to fifteen nanometers thick.

5. The tunneling bipolar field effect transistor of claim 3 wherein the second channel quantum well is in the range of ten to fifteen nanometers thick.

6. A tunneling field effect transistor comprising: a semi-insulating crystalline substrate; a buffer layer comprising a wide bandgap material covering the substrate;

a first N-channel comprising a first narrow bandgap material covering a portion of the buffer layer; a first barrier comprising a wide bandgap material covering the first N-channel;

a P-channel comprising a second narrow bandgap material covering the first barrier layer; a second barrier comprising the wide bandgap material covering the P-channel;

a second N-channel comprising the first narrow bandgap material covering the second barrier layer; a third barrier comprising the wide bandgap material covering the second channel and serving as a cap layer;

a gate electrode formed on an upper surface of the third barrier and making Schottky contact to the third barrier;

an N-type drain region electrically coupled to each of the first and second N-channels on a first side of the gate electrode; and a P-type source region electrically coupled to the P-channel on an opposite side of the gate electrode.

7. The tunneling bipolar field effect transistor of claim 6 further comprising a drain conductor making ohmic contact to the drain region and positioned on the upper surface of the cap layer and a source conductor making ohmic contact to the source region and positioned on the upper surface of the cap layer.

8. The tunneling bipolar field effect transistor of claim 6 wherein the first narrow bandgap material is indium arsenide, the second narrow bandgap material includes gallium antimonide, and the wide bandgap material includes aluminum antimonide.

9. The tunneling bipolar field effect transistor of claim 8 wherein the P-channel quantum well is in the range of ten to fifteen nanometers thick.

10. The tunneling bipolar field effect transistor of claim 8 wherein the first N-channel quantum well is more than ten to fifteen nanometers thick and the second N-channel quantum well in in the range of ten to fifteen nanometers thick.

11. A tunneling field effect transistor comprising: a crystalline substrate; a buffer layer formed on the substrate; an first quantum well channel of a first conductivity type formed on the substrate; a barrier layer comprising a wide bandgap material covering the first channel; a second quantum well channel of a second conductivity type covering the barrier layer; a cap layer comprising a wide bandgap material covering the second quantum well channel; a gate electrode positioned over the first channel and the second quantum well channels, wherein charge stored in the gate electrode controls alignment of occupied states in the first channel with empty states in the second channel; a drain region of the first conductivity type electrically coupled to the first quantum well channel and formed on a first side of the gate electrode; and a source region of the second conductivity type electrically coupled to the second quantum well channel and formed on a second side of the gate electrode.

* * * * *